United States Patent [19]
Tillinghast et al.

[11] Patent Number: 5,278,796
[45] Date of Patent: Jan. 11, 1994

[54] TEMPERATURE-DEPENDENT DRAM REFRESH CIRCUIT

[75] Inventors: Charles W. Tillinghast; Michael S. Cohen; Thomas W. Voshell, all of Boise, Id.

[73] Assignee: Micron Technology, Inc., Boise, Id.

[21] Appl. No.: 684,422

[22] Filed: Apr. 12, 1991

[51] Int. Cl.$^5$ ............................................. G11C 11/34
[52] U.S. Cl. .................... 365/211; 365/222; 365/227
[58] Field of Search .................. 365/211, 222, 226–

[56] References Cited

U.S. PATENT DOCUMENTS 3,851,316 11/1974 Kodama .................... 365/222 X
4,920,489 4/1990 Hubelbank et al. ............ 128/710 X

FOREIGN PATENT DOCUMENTS 0160896  7/1986 Japan .................................. 365/222
0050392  2/1990 Japan .................................. 365/222
0297792 12/1990 Japan .................................. 365/222

Primary Examiner—Seungsook Ham
Attorney, Agent, or Firm—Stanley N. Protigal

[57] ABSTRACT

A temperature sensing circuit allows a DRAM array to use less power than would normally be possible due to the reduced refresh rate based on the temperature of the DRAM array. The temperature circuit removes the refresh guardbanding on the DRAMS. Instead of refreshing a 1 megabyte DRAM every 8 ms, refreshing the DRAMs every 128 ms is possible, depending on the temperature of the DRAM array.

22 Claims, 2 Drawing Sheets

TEMPERATURE-DEPENDENT DRAM REFRESH CIRCUIT

FIELD OF THE INVENTION

This invention relates to the field of data storage for electronic devices. More specifically, a refresh circuit for dynamic random access memories (DRAM) is described which sets the refresh rate based on the temperature of the DRAM, thereby reducing the power consumed by the DRAM array.

BACKGROUND OF THE INVENTION

Portable computers are power budget limited due to the requirement of being able to operate from batteries. Any technique which will lower the power requirement for the machine will, therefore, result in longer battery life. Memory can be a significant factor in power budget considerations, especially as more memory is required by emerging applications.

The systems designer has various choices for memory design. One choice is complementary metal oxide semiconductor (CMOS) static random access memory (SRAM). This device uses either a four or six transistor cell which implements a static storage mechanism requiring no refresh cycles. Six transistor (slow SRAM) devices have the added advantage of consuming very little power, but usually lag behind components such as DRAM in memory density. The per bit cost of SRAM is higher than that of DRAM.

Another choice is to use one transistor cell DRAMS. Unfortunately, the DRAM needs continuous refreshing which requires more power than a static CMOS implementation. Although the DRAM's simpler storage mechanism produces a lower cost per bit than SRAMS, its power requirements prevent it from adequately serving portable computers.

The requirement to refresh the DRAM is basic to the storage technique used in the DRAM cell. In this cell, data is stored as a charge of electrical energy trapped on a capacitor. Because the capacitor experiences leakage, the cell must be recharged or "refreshed" every so often. In today's technology, a 4 megabyte DRAM cell for example must be refreshed every six milliseconds at 70° C.

Leakage of charge from the DRAM cell is mainly temperature dependent. Refresh times are always specified at the highest allowed operating temperature for the DRAM chip, as the leakage rate accelerates with increasing temperature. For every 12° C. increase in temperature, the refresh rate must be doubled. If refresh rates can be adjusted for temperature, DRAM power consumption may be lessened, thereby allowing DRAMs to be candidates for use in portable computers and other devices which are battery powered.

U.S. Pat. No. 4,920,489 describes a circuit which adjusts the DRAM refresh rate based on the ambient temperature. This invention employs a thermistor in proximity to the DRAMs and a resistor to form a voltage divider, the output of which is digitized by an A/D converter inside the processor. The processor in turn controls the refreshing of the DRAMs at a rate controlled by a table accessed by the processor using the value digitized from the voltage divider. Thus the resolution of the refresh is equal to the table granularity.

SUMMARY OF THE INVENTION

An object of this invention is to provide a memory support circuit which is especially suited for use in a portable computer by allowing DRAMs, which have a low cost and low power consumption, to supply memory to the computer. Another object of this invention is to provide a circuit to a DRAM array which allows the DRAMs to consume less power while providing equal functionality.

These objects of the present invention are obtained with a refresh time optimization circuit, which takes into account the temperature of the DRAM to determine the required refresh rate. The use of this circuit significantly reduces the power consumption of the DRAM array.

Temperature compensation is accomplished in the following manner: A solid state temperature sensor such as an IM35 available from National Semiconductor is located in proximity to the DRAM array and outputs a voltage proportional to its temperature, thereby reflecting the temperature of the DRAMS. The output of the sensor is sent through an attenuator to a group of four analog voltage comparators. The comparators are arranged such that their references are connected to taps on a voltage divider. The voltage divider is arranged so that each tap increases in potential by 14 millivolts thereby representing incremental steps of 14° C.

The refresh rates most semiconductor devices require normally double for every 12° C. increase in temperature, and the 14° C. steps of the invention allow for guardbanding. Note that the actual temperature ranges may change with the technology, and the 14° C. steps and ranges described in this disclosure, while applicable with present technology, show just one possible implementation of the invention. The temperature ranges may cover from 11° C. to 15° C. The comparators will, therefore, switch at 14° C., 28° C., 42° C., and 56° C. This will provide an indication of five bands of temperature ranging from below 14° C. to above 56° C. The circuit can include a greater or lesser number of bands as desired, and increments other than 14° C. can also be implemented from the description by one of ordinary skill in the art. The comparators will feed a priority encoder which may be implemented with discreet components or by an ASIC logic device. The output of the encoder has three bits producing a binary number from 0 to 7. Only the numbers from zero through four will be used in the embodiment with four comparators, with each number representing a temperature band indicating the temperature of the temperature sensor, which in turn reflects the temperature of the DRAMS. These three outputs are connected to resistors, with each resistor representing the binary weight of the particular output. The outputs of the resistors are connected together and form a summing node which connects to an r/c oscillator circuit thus providing binary control of the oscillator's frequency. The output of the oscillator will be a square wave whose frequency represents the temperature of the DRAM array. This output is connected to system logic which will use this signal to produce a DRAM refresh sequence thus producing temperature compensated DRAM refresh.

The number of comparators can be increased to any number. As the number of comparators and therefore the number of different temperature ranges increases, the more accurate the refresh rate becomes. However, a point is reached where the power consumed by the circuit exceeds the power savings from the reduced refresh rate.

The inventive design described breaks the temperature into five bands, and is therefore a simpler design which is more easily implemented than the invention in the referenced U.S. Pat. No. 4,920,489. It is also faster than the circuit described in the referenced patent since accessing a table is not necessary, and a microprocessor is not required to do so.

A second embodiment is also possible using one comparator which would allow for only two refresh rates. This circuit would not require an encoder since the binary output of the comparator could control the oscillator directly. This circuit, while easily implemented, is of limited value since the refresh control is of such a gross granularity. It may be of some value in some instance and is included as a matter of completeness to show a minimal embodiment of the invention.

DETAILED DESCRIPTION OF THE PREFERRED EMBODIMENT

Figure 1:
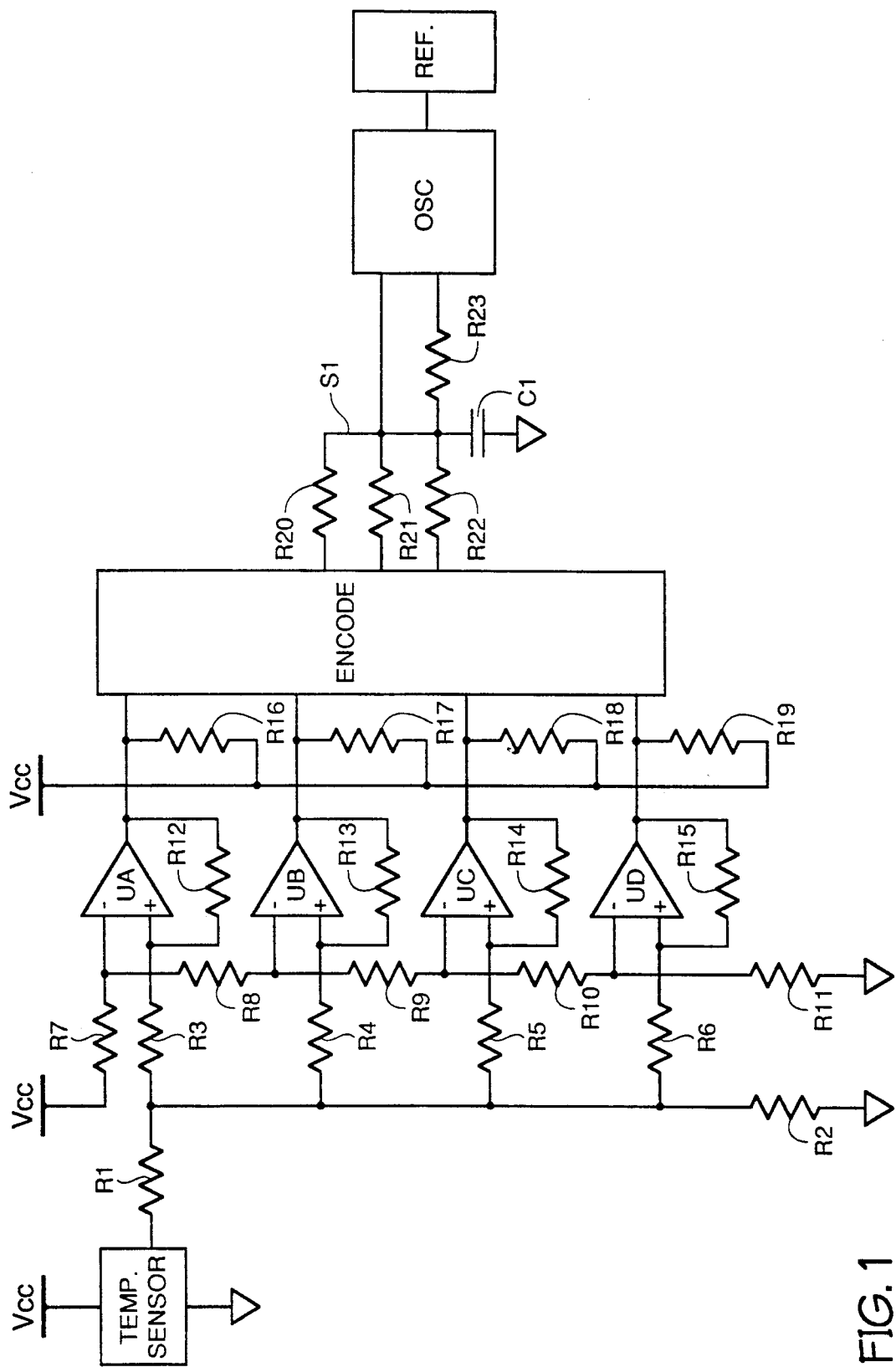
FIG. 1 is a schematic diagram of a circuit which breaks down the information supplied by the temperature sensor into five ranges.

An embodiment of the invention having four comparators and five refresh rates based on temperature, as shown in FIG. 1, includes the following elements:

1) A temperature sensor outputs an analog signal corresponding to the temperature of the sensor and reflects the temperature of the DRAMs (not shown) which are in physical proximity to the sensor.

2) Four comparators UA-UD divide the analog signal from the temperature sensor into five temperature bands with four outputs to an Encoder.

3) An encoder outputs three bits which can represent a binary number from 0 to 7. Only the numbers from 0 through 4 will be used on this embodiment, however, with each value representing one of five possible temperature bands indicating the temperature of the sensor, which in turn reflects the temperature of the DRAMS.

4) The three binary outputs of the encoder are each connected to a resistor R20-R22 with the value of each resistor being different and representing the binary weight of its particular output.

5) The outputs of the resistors are connected together and form a summing node Si. The voltage on the summing node reflects the potential determined by the encoder's binary output.

6) A resistor R23 between the summing node S1 and an oscillator OSC divides the voltage on the summing node S1 to a value compatible with the oscillator input.

7) The voltage on summing node S1 therefore controls the oscillation frequency of the r/c oscillator OSC. The signal output by the oscillator will be a square wave with one of five possible frequencies, depending on the voltage on the summing node S1. The frequency output by the oscillator OSC represents one of five bands of temperature, for example below 14° C., between 14° C. and 28° C., between 28° C. and 42° C., between 42° C. and 56° C., and above 56° C.

8) A refresh counter and gate circuit REF counts down to 0 pulses then provides a timed "refresh" signal to the DRAM array at one of five possible rates. A 1 megabyte DRAM, for example, must be refreshed every 8 ms at 70° C. Using the inventive refresh circuit, if the temperature is above 56° C., the DRAMs will be refreshed every 8 ms. If the temperature is between 42° C. and 56° C. the DRAMs will be refreshed every 16 ms, and for temperatures between 28° C. and 42° C. the DRAMs will be refreshed at 32 ms. Between 14° C. and 28° C., the DRAMs will be refreshed every 64 ms. Below 14° C., the DRAMs are refreshed at 128 ms. Note that these temperature ranges, the number of ranges, and refresh rates may change with the technology, providing lower refresh rates if possible, and refresh less often at various temperatures where the improved technology allows. Circuits which perform the actual refresh of the devices are well known in the art.

FIG. 1 is shows the temperature sensing circuit analog functions. The temperature sensor IC outputs, for example, 10 mV/° C. R1 and R2 form a voltage divider to scale the output of the sensor to match the comparator's inputs. R3 through R6 minimize the effects of hysteresis of one comparator on the remaining comparators. R7 through R11 form the voltage reference divider, and cause each comparator to trip at a different temperature sensor output voltage. R12 through R15 provide hysteresis to each of the four comparators, UA, UB, UC, and UD respectively. R16 through R19 are pull up resistors on the open collector outputs of the comparators to establish the digital "high" level.

R20 through R22 each have a different value, the value of each resistor representing the binary weight of the encoder output with which it is coupled. The outputs of R20, R21, and R22 are connected together and form a summing node. The voltage on the summing node reflects the potential determined by the binary encoder output, and further represents the value of the comparator outputs. These resistors in conjunction with C1 and R23 form a time constant network for controlling the oscillator OSC. The voltage on the summing node S1 therefore controls the oscillation frequency of oscillator OSC.

If the temperature of the temperature sensor is below 14° C., the sensor will output less than 140 mV, which is not enough to trip any of the comparators, so all comparators will be turned off. All comparators off, therefore, represents a temperature of below 14° C. The encoder will output a binary 0 on each of its three outputs, which causes the oscillator to output some minimum value, thereby causing the refresh block to send a refresh pulse every 128 ms.

As the temperature of the sensor increases past 14° C., the temperature sensor outputs 140 mV which trips comparator UD, thereby causing the encoder to output a binary 1 on its three outputs, which causes the oscillator to increment its output, thereby causing the refresh block to send a refresh signal more often (every 64 ms).

As the temperature increases, each comparator, in order, is turned on. The outputs of the four comparators, therefore, can be used to refresh at five different refresh rates. Above 56° C., all four comparators are turned on, which causes the refresh block to send a refresh pulse every 8 ms.

Figure 2:
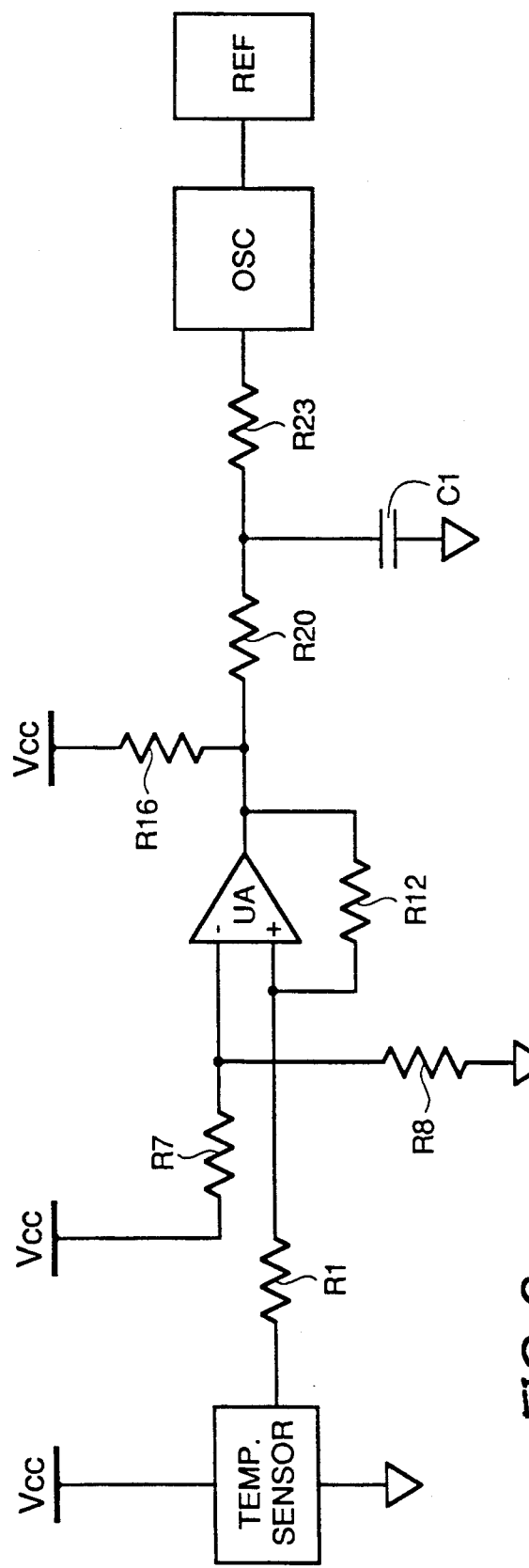
FIG. 2 is a schematic diagram of a circuit which breaks down the information supplied by the temperature sensor into two ranges.

FIG. 2 is a schematic diagram of a minimum embodiment of the invention. R1 scales the output of the temperature sensor to match the input of the single comparator UA. Resistor network R7 and R8 forms the voltage divider to provide a reference voltage to UA and represents the threshold between two temperature ranges.

R12 provides hysteresis to the comparator. R16 establishes a digital high on the comparator output. In addition, R16 in conjunction with C1, R20, and R23 form a resistor/capacitor network setting the frequency of the refresh oscillator OSC. R20 couples the output of comparator UA to this network. When the comparator output is high, additional current from $V_{cc}$ through R16 decreases the charge up time of C1 thus setting a particular frequency for OSC. When the comparator output is low, R16 is out of the circuit and R20 and R23 set a higher frequency for OSC. The oscillator will output one of two frequencies, depending on the temperature of the temperature sensor. An embodiment with more than two ranges of temperature would need an encoder to scale the plurality of digital outputs of the comparators into an analog input voltage to the oscillator.

What has been described is a specific configuration of the invention, as applied to a particular embodiment. Clearly, variations can be made to the original design described in this document for adapting the invention to other embodiments. For example, various components can be substituted for those of FIG. 1 (such as a thermocouple replacing the temperature sensor) without changing the scope or function of the invention. As previously stated, the number of comparators can be altered, and the temperature ranges and temperatures at which each of the comparators is tripped can be different than the stated values. In addition, the circuit can be used to refresh any type of component which requires refresh. Therefore, the invention should be read as limited only by the appended claims.

We claim:

1. A circuit f or setting the refresh rate of a logic component based on the temperature of the component, comprising:
   a) a temperature sensor having an output which reflects the temperature of the logic component;
   b) a plurality of comparators, each comparator having a first input coupled to a voltage divider between a $V_{cc}$ source and ground, a second input coupled to said temperature sensor output, and an output;
   c) an encoder having at least two binary outputs, said encoder receiving said comparator outputs and encoding said comparator outputs into a binary signal on said binary outputs;
   d) at least two binary weight resistors with at least one binary weight resistor coupled to each of said binary outputs, with each binary weight resistor having a different value such that each of said binary outputs has a different binary weight;
   e) a summing node, said binary weight resistors on said binary outputs interposed between said summing node and said encoder, said summing node having a voltage which reflects said binary signal;
   f) an oscillator coupled with said summing node, said oscillator outputting a timed signal based on said voltage on said summing node; and
   g) refresh circuitry which initiates a refresh of the component upon receipt of said timed signal.

2. The circuit of claim 1 wherein the number of said comparators determines a number of temperature ranges, each of said temperature ranges having a different refresh rate.

3. The circuit of claim 2 wherein a separate second comparator input resistor is interposed between said temperature sensor output and each said second comparator inputs, thereby minimizing the effects of hysteresis of one comparator on another comparator.

4. The circuit of claim 3 wherein a separate voltage divider resistor is interposed between said $V_{cc}$ source and each first comparator input thereby forming a voltage divider between each of said comparators.

5. The circuit of claim 4 wherein each comparator further comprises feedback means coupling said comparator output with said second comparator input, said feedback means comprising a hysteresis resistor interposed between said comparator output and said second comparator input thereby providing hysteresis to each comparator.

6. The circuit of claim 5 wherein a separate high resistor is interposed between a $V_{cc}$ source and each of said comparator outputs thereby establishing a digital high level to said encoder.

7. The circuit of claim 6 wherein a resistor interposed between said summing node and an input of said oscillator divides said voltage on said summing node to a value compatible with said oscillator.

8. The apparatus claim 2 wherein the refresh rate is approximately doubled when the temperature sensed by said temperature sensor enters a higher temperature range.

9. The apparatus of claim 8 wherein each of said temperature ranges covers from 11° C. to 15° C.

10. A circuit for setting the refresh rate of a logic component based on the temperature of the component, comprising:
    a) a temperature sensor having an output which reflects the temperature of said logic component;
    b) a comparator having a first input coupled to a voltage divider between a $V_{cc}$ source and ground, a second input coupled to said temperature sensor output, and output, and a feedback loop comprising a first resistor interposed between said comparator output and said second comparator input thereby providing hysteresis to said comparator;
    c) a second resistor interposed between said temperature sensor output and said second comparator input, thereby scaling said second comparator input;
    d) a third resistor interposed between said $V_{cc}$ source and said first comparator input, thereby scaling said first comparator input and forming a voltage divider;
    e) an oscillator coupled with said comparator output, said oscillator outputting a timed signal based on said output of said comparator; and
    f) refresh circuitry which initiates a refresh of the component upon receipt of said timed signal, wherein said refresh rate changes when said comparator output switches from a first digital level to a second digital level.

11. The circuit of claim 10 wherein a fourth resistor is coupled between a $V_{cc}$ source and said comparator output thereby establishing a digital high level to said oscillator.

12. The circuit of claim 11 wherein a fifth resistor interposed between said comparator and said oscillator divides said voltages on said comparator output to a value compatible with said oscillator.

13. The apparatus of claim 10 wherein the refresh rate is approximately doubled when the temperature sensed by said temperature sensor increases to cause said comparator to trip.

14. A circuit for setting the refresh rate of a random access memory array based on the temperature of the array, the circuit comprising:
   a) a temperature sensor having an output which reflects the temperature of the memory array;
   b) a plurality of comparators, each comparator having a first input coupled to a voltage divider between a first power source and ground, a second input coupled to said temperature sensor output, and an output;
   c) an encoder having at least two binary outputs, said encoder receiving said comparator outputs and encoding said comparator outputs into a binary signal on said binary outputs;
   d) at least two binary weight resistors with at least one binary weight resistor coupled to each of said binary outputs, with each binary weight resistor having a different value such that each of said binary outputs has a different binary weight;
   e) a summing node, said binary weight resistors on said binary outputs interposed between said summing node and said encoder, said summing node having a voltage which reflects said binary signal;
   f) an oscillator coupled with said summing node, said oscillator outputting a timed signal based on said voltage on said summing node; and
   g) refresh circuitry which initiates a refresh of the memory array upon receipt of said timed signal.

15. The circuit of claim 14 wherein the number of said comparators determines a number of temperature ranges, each of said temperature ranges having a different refresh rate.

16. The circuit of claim 15 wherein a separate second comparator input resistor is interposed between said temperature sensor output and each second comparator input, thereby minimizing the effects of hysteresis of one comparator on another comparator.

17. The circuit of claim 16 wherein a separate voltage divider resistor is interposed between said power source and each first comparator input thereby forming a voltage divider between each of said comparators.

18. The circuit of claim 17 wherein each comparator further comprises feedback means coupling said comparator output with said second comparator input, said feedback means comprising a hysteresis resistor interposed between said comparator output and said second comparator input thereby providing hysteresis to each comparator.

19. The circuit of claim 18 wherein a separate high resistor is interposed between a second power source and each of said comparator outputs thereby establishing a digital high level to said encoder.

20. The circuit of claim 19 wherein a voltage divider resistor interposed between said summing node and an input of said oscillator divides said voltage on said summing node to a value compatible with said oscillator.

21. The apparatus of claim 15 wherein the refresh rate is approximately doubled when the temperature sensed by said temperature sensor enters a higher temperature range.

22. The apparatus of claim 21 wherein each of said temperature ranges is between 11° C. and 15° C.

* * * * *